United States Patent
Hayashi et al.

(10) Patent No.: US 10,501,342 B2
(45) Date of Patent: Dec. 10, 2019

(54) UV-C WATER PURIFICATION DEVICE

(71) Applicant: SIGNIFY HOLDING B.V., Eindhoven (NL)

(72) Inventors: Daiyu Hayashi, Eindhoven (NL); Jianghong Yu, Eindhoven (NL); Paul Dijkstra, Eindhoven (NL); Michiel Van Der Meer, Eindhoven (NL); Arie Jan Hovestad, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 46 days.

(21) Appl. No.: 15/559,280

(22) PCT Filed: Mar. 10, 2016

(86) PCT No.: PCT/EP2016/055130
§ 371 (c)(1),
(2) Date: Sep. 18, 2017

(87) PCT Pub. No.: WO2016/150718
PCT Pub. Date: Sep. 29, 2016

(65) Prior Publication Data
US 2018/0086649 A1    Mar. 29, 2018

(30) Foreign Application Priority Data
Mar. 20, 2015    (EP) .................................. 15160017

(51) Int. Cl.
*C02F 1/32* (2006.01)
*H01L 33/58* (2010.01)
(Continued)

(52) U.S. Cl.
CPC ...... *C02F 1/325* (2013.01); *C02F 2201/3222* (2013.01); *C02F 2201/3227* (2013.01);
(Continued)

(58) Field of Classification Search
CPC .............. C02F 1/325; C02F 2201/3222; C02F 2201/3227; C02F 2201/3228; H01L 33/58;
(Continued)

(56) References Cited

U.S. PATENT DOCUMENTS

| 2004/0189212 A1* | 9/2004 | Ashida ................. H01J 61/125 315/97 |
| 2006/0138443 A1 | 6/2006 | Fan et al. |

(Continued)

FOREIGN PATENT DOCUMENTS

| JP | 2005103349 A | 4/2005 |
| KR | 101333746 B1 * | 12/2013 |

(Continued)

OTHER PUBLICATIONS

Y.T. Habtemichael, "Packaging Designs for Ultraviolet Light Emitting Diodes", A Thesis Presented to the Academic Faculty, G.W. Woodruff School of Mechanical Engineering, Georgia Institute of Technology, Dec. 2012, pp. 1-105.

*Primary Examiner* — Walter D. Griffin
*Assistant Examiner* — Cameron J Allen
(74) *Attorney, Agent, or Firm* — Meenakshy Chakravorty

(57) ABSTRACT

Methods and apparatus are provided for ultraviolet (UV) water purification, comprising UV-C LED modules having improved light extraction efficiency. UV-C LED dies (12) are solidly coupled to associated translucent output windows (14), such that light is transmitted directly from light-emitting surface(s) of the dies (12) to output window(s) (14) of the LED package—without propagation across interstitial air gaps. Gas-to-solid (and solid-to-gas) light transition boundaries are thus eliminated, significantly reducing the amount of light lost through inter-medium boundary reflection, and thereby increasing efficiency of light extraction.

7 Claims, 13 Drawing Sheets

(51) Int. Cl.
*H01L 25/16* (2006.01)
*H01L 33/56* (2010.01)

(52) U.S. Cl.
CPC .. *C02F 2201/3228* (2013.01); *C02F 2303/04* (2013.01); *H01L 25/167* (2013.01); *H01L 33/56* (2013.01); *H01L 33/58* (2013.01); *H01L 2224/48091* (2013.01); *H01L 2924/181* (2013.01)

(58) Field of Classification Search
CPC .......... H01L 33/56; H01L 2224/48091; H01L 2924/181; H01L 25/167; H01L 2924/00012; H01L 2924/00014
See application file for complete search history.

(56) References Cited

U.S. PATENT DOCUMENTS

| | | |
|---|---|---|
| 2013/0078411 A1 | 3/2013 | Gaska et al. |
| 2014/0203311 A1 | 7/2014 | Schowalter et al. |
| 2014/0263091 A1 | 9/2014 | Carter, III et al. |
| 2014/0264359 A1 | 9/2014 | Zimmerman et al. |
| 2014/0367734 A1 | 12/2014 | Kneissl et al. |

FOREIGN PATENT DOCUMENTS

| | | |
|---|---|---|
| WO | WO2007146860 A1 | 12/2007 |
| WO | WO2013040652 A1 | 3/2013 |

* cited by examiner

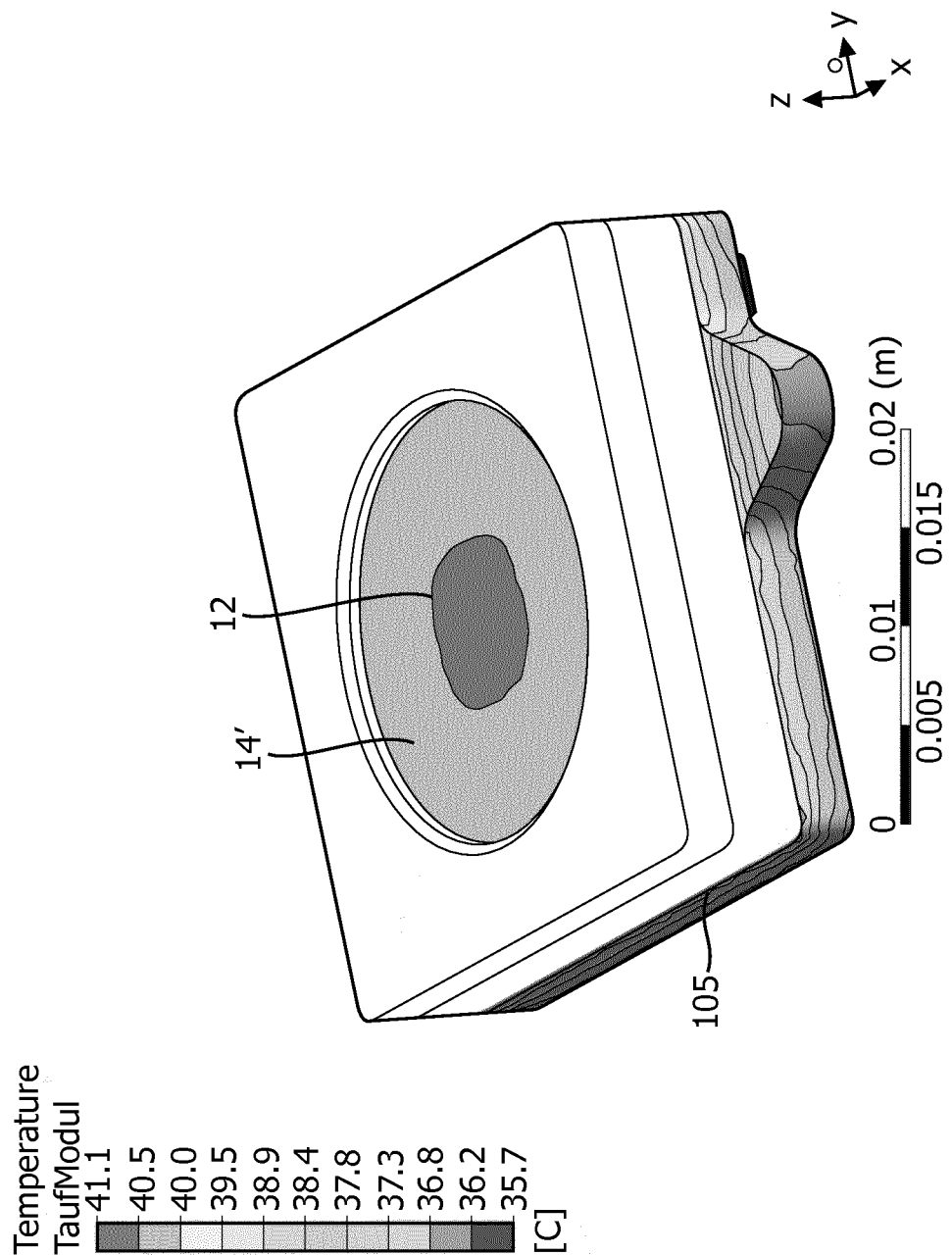

UV-C WATER PURIFICATION DEVICE

CROSS-REFERENCE TO PRIOR APPLICATIONS

This application is the U.S. National Phase application under 35 U.S.C. § 371 of International Application No. PCT/EP2016/055130, filed on Mar. 10, 2016, which claims the benefit of European Patent Application No. 15160017.8, filed on Mar. 20, 2015. These applications are hereby incorporated by reference herein.

FIELD OF THE INVENTION

This invention relates to a water purification device using ultraviolet light.

BACKGROUND OF THE INVENTION

The use of UV light—in particular UV-C light—for the purification of water, or more precisely the disinfection and sterilization of water, (hereafter referred, for the sake of simplicity, as water purification or purification of water) is a well-known and well established technical practice. Utilizing UV-C is an efficient way for purifying water reservoirs without the need to add chemicals or for frequent cleaning. UV-C light at sufficiently short wavelengths is mutagenic to bacteria, viruses and other micro-organisms. At a wavelength of around 265 nm, UV breaks molecular bonds of DNA in the cells of micro-organisms, producing thymine dimers in the DNA, thereby destroying the DNA structure necessary to reproduce the cell, rendering them harmless or prohibiting growth and reproduction. The main considerations when designing a UV-C system for UV-C inactivation to be efficient are source intensity and exposure time. Source intensity (also known as lamp intensity) is a function of the sources' radiant energy and the distance to the surface to be irradiated. Once an intensity factor is established it is simple to determine how long the surface needs to be exposed.

In order to have a significant reduction in the micro-organisms present, an energy dosage of over 6000 mJ/cm$^2$ to 8000 mJ/cm$^2$ or greater is required.

More recently, demand has grown for UV-C water purification devices which can utilize technologies from the fast developing field of UV-C LED light sources. It is well known, for example, that semiconductor materials of group IIIA-nitrides ($Al_xGa_{1-x-y}In_yN$, [0<$/$=x+y<$/$=1]) have direct band gaps that can be used to generate electromagnetic radiation in the wavelength of ultraviolet (UV). For instance, ($Al_xGa_{1-x}N$ (0<x<1)) is often utilized as the component for light emitting diode (LED), generating UV radiation below 365 nm.

In terms of above mentioned water purification, UV-C LED solutions confer numerous advantages over more traditional fluorescent or incandescent UV-C lamps, including for example fast switching capability, small form factor, long lifetime, and a significantly 'cleaner' material composition—comprising few hazardous or harmful component materials.

However, UV-C LEDs, as per the state of the art, continue to suffer significant problems with regards efficient light extraction from both LED dies themselves, and also from LED die packages, especially when compared to the advances made in the field of conventional LEDs. The wall plug efficiency of UV-C LEDs is much lower than that of conventional blue LEDs, leading to the effect that the UV-C LEDS generate more heat. In addition, the temperature range in which the UV-C LEDs can be used, so that they provide useful lifetimes that are suitable for practical applications, is much lower than that of blue LEDs. The heating of the junction of the UV-C LED is dramatically reducing the performance of the light source and subsequently is reducing the lifetime. Typical UV-C LED packages or modules use a glass (quartz glass, sapphire or fused silica) window transparent in the UV-C wavelength range, which is attached to a ceramic cavity. The glass window is not directly attached to the die, and emitted light must travel across an intermediary air cavity in order to exit through the glass window. As a result, a significant portion of any generated light is reflected at the window boundary, this reflected light subsequently being lost, since the surrounding cavity typically comprises non-reflective materials such as ceramic (Aluminia, AlN) or metallic Au, Cu.

This poor light extraction efficiency has significant detrimental effects for water purification devices seeking to incorporate UV-C LED technologies. In particular, for the generation of a given required light intensity, or 'dose', either a greater density of LED packages is required to be incorporated, or a larger drive current is required to be provided. In the first instance, this will typically incur both greater bulk and weight to the final product, and greater per-unit production costs. In the latter case, running costs are typically increased, and, for a handheld device for example, added weight is also incurred in the form of a larger number of, or greater EMF capacity of, batteries or cells.

Desired therefore is a UV-C LED water purification device, comprising UV-C LED packages having an improved light extraction efficiency, thereby allowing for an increased light intensity capacity, without incurring any increased bulk or weight to the device, nor significantly increasing overall operating costs.

SUMMARY OF THE INVENTION

The invention is defined by the claims.

According to an aspect of the invention, there is provided a UV-C water purification device, comprising:
  one or more UV-C LED modules for administering UV-C light to a body of water, each module comprising:
    one or more UV-C LED dies, each die having a bottom surface and a top surface, and
    one or more UV-C-translucent window elements,
    wherein each of the UV-C LED dies is solidly coupled against an associated UV-C-translucent window element, such that at least one of the bottom or top surfaces of the UV-C die is in optical communication with the associated UV-C-translucent window element.

There are thus provided UV-C generating LED modules for the application of UV-C light to water, each module comprising one, or a plurality of, UV-C LED packages. Each package comprises a UV-C LED die and an associated UV-C translucent window element for transmitting the light generated by the die, the two physically coupled such that the LED die is engaged solidly against the translucent window, and such that the emitting surface of the die is facing, or is in direct optical communication with, a light transmitting surface of the window element. The coupling might be such, for example, that the die and associated window element are in direct contact with one another, with a surface of the die—a light emitting surface for example—touching a corresponding light transmitting surface of the window element. Alternatively, the die and window element might be indirectly physically coupled, via, for example, an intermediate adhesive layer, or optical layer, such that the two adhere solidly with one another but do not comprise directly touching surfaces.

Since, for some of the provided UV-C LED packages, the UV-C LED die is coupled solidly with the associated window element, there is no interstitial air gap disposed between the two, and light emitted at the light-emitting surface of the die may be transmitted to the output window of the package entirely through solid media. In the case that the die is coupled directly to the window, such that the two comprise touching surfaces, the light may pass directly from the emitting surface of the die to the transmitting surface of the window. Hence light that ordinarily would be lost due to reflection at the boundary between the air gap and the output window (in a ceramic cavity-type arrangement, as discussed above), is in the case of the present invention conserved, thereby increasing the overall efficiency of the LED packages.

In the case that the two are physically adhered via an intermediary solid layer, such as an adhesive or secondary optic, the light must additionally pass through said intermediary layer before reaching the translucent output window, with the consequence that some light will be lost due to reflection at the boundary between the intermediary layer and the window element. However, since according to this aspect of the invention, the intermediary layer is a solid layer, the proportion of light lost is significantly less than in the case of an air layer disposed between the die and the window—since the refractive indices of two solids may be selected to be far closer than those of a solid and a gas.

Hence embodiments of the invention improve overall light extraction efficiency of UV-C LED modules, through an optical arrangement which eliminates unnecessary air-to-solid transition boundaries, and thereby conserves portions of generated light which would otherwise have been lost to boundary reflection.

In some embodiments, modules may comprise multiple dies coupled to a single window element. The multiple dies might be arranged to form an array, for example, such that the window forms a single broad light emission surface. In other examples, however a single window element might be coupled to each individual die. According to some embodiments, each module might comprise just a single LED-window assembly, while in others, modules might comprise arrangements of pluralities of LED-window assemblies.

According to certain embodiments, the water purification device may comprise a vessel for containing a body of water to be purified, and comprise modules disposed about the peripheries of the vessel, or inside the vessel, for administering doses of UV-C light.

In a device having a vessel with an inner surface area of 1000 cm$^2$, and providing a flux of 1.6 mW for 24 hours a dosage of about 138 mJ/cm$^2$ (13824 µW S/cm$^2$) can be reached with one UV-C LED. This is well above the necessary dose to inhibit (most) colony formation in organisms (90%) and even for 3-Log (99.9%) reduction. Table 1 shows the UV-C dose required for a 99.7% kill rate.

TABLE 1

| UV-C dose required for a 99.7% kill rate. | |
| --- | --- |
| Disease | µW S/cm$^2$ |
| Ringworm | 6100 |
| MRSA | 6500 |
| Impetigo | 8000 |

TABLE 1-continued

| UV-C dose required for a 99.7% kill rate. | |
| --- | --- |
| Disease | µW S/cm$^2$ |
| E. coli | 7000 |
| Thyphoid Fever | 12000 |
| Hepatitis | 8000 |
| Influenza | 6600 |

As the micro-organism reduction is dose dependent, the LEDs may be operated within time intervals, these may be for example, once a day or multiple times a day for a limited total operating time per day.

The UV-C LED may be powered for a total of, for example, 1 hour per day or it may be operated in a higher frequency of short pulses. Such driving schemes lend themselves to low power supplies such as a small solar panel or a small battery. In some embodiments, a UV-C module is provided with circuitry containing none, or very limited, power storage capabilities such that the growth of micro-organisms on a surface or within a certain environment is reduced or prevented. The module converts the light incident on the solar panel into power that is supplied to the UV-C module which then emits flashes of UV-C radiation.

It can be seen that many consumer devices would benefit from comprising a UV-C module which has the capability of generating its own power, that is to say a module that does not require batteries or a power line connection. Some embodiments may contain a small capacitor that is capable of storing a small amount of energy, this leads to advantages of cost, complexity, longevity and a maintenance free solution.

The solar energy is captured by the solar panel and converted to an electrical current flowing into the circuit and stored in an energy storage device, preferably a small capacitor, until sufficient energy is captured to flash the UVC-LED in a most energy efficient, favorable and energy economical way.

The UVC-LED is flashed until the energy storage device (capacitor) is discharged, or, until the capacitor contains an insufficient amount of charge to operate the UVC-LED in an economical way.

In this respect, the system differs from known systems containing solar panels. In the known systems the energy is captured in an energy storage device like a rechargeable battery, until there is a desire or need to use the captured energy. This may be a relatively long time period after the energy is captured. In the proposed system the LED is driven in a flashing manner as soon as the capacitor has stored the required energy to flash the LED, this means that there is a much shorter storage period and this leads to much smaller demands being placed on the storage capacity thus allowing a smaller storage solution. The reduction in complexity and size of the energy storage facilities allows a more compact module to be implemented in a wider range of consumer devices.

Particularly interesting consumer devices may be applications where a system might be in an off state for a relatively long period of time, (e.g. during a holiday period). The growth of micro-organisms in such systems is undesirable, this may be particularly relevant in systems that are providing liquids for human consumption such as a coffee machine or systems that atomize small droplets of water into the atmosphere such as an air humidifier.

The air humidifier is a very effective way of spreading any unwanted micro-organisms in an environment as the small droplets can impinge on numerous vertical and horizontal surfaces including the underside of a desk or table etc. In such circumstances the growth of microorganisms in such devices is prevented by the daily dose of UV-C being provided by a module that is driven by daylight incident on the solar cells.

Since the water is often stored in such containers for a relatively long period of time, undesired micro-organisms may grow in the water, this may lead to health risks when the device is next used. Due to the above mentioned low efficiency of UV-C LEDs it may be important to maximize the concentration of UV-C radiation in a specific area. In the case of a water container in a humidifier it may be beneficial to concentrate the UV-C light intensity in the area surrounding the exit valve of the water container. To further increase the effectiveness of the system the water flow may be managed so that the water exiting the container via the valve has received a desired UV-C dose level.

Another embodiment provides a UV-C LED spot module within a coffee machine. The water container within a coffee machine is typically open at the top and the container slides into an opening in the coffee machine. The UV-C LED spot module is mounted within the coffee machine above the opening that the water container slides into, and is aimed towards the water container. The advantage of this example is that the electrical power to be provided to the LED can be supplied using a simple, fixed electrical connection as the water container moves in relation to the UV-C LED and not vice versa.

A further embodiment provides a UV-C LED module within a coffee machine, similar to the previous embodiment, the UV-C spot module is positioned within the machine such that the UV radiation is aimed towards the water container. In this embodiment however, a UV-C transparent tube is located within the water container. The UV-C spot module is positioned such that the UV-C radiation is focused towards the tube. The volume of the tube may match the volume of a single cup that the machine provides, such that the brewed coffee originates from the water that has been most recently purified inside the UV-C transparent tube. The system may be designed such that the water in the UV-C transparent tube receives a minimum dose of UV-C light.

The UV-C LED may be positioned inside the water container, above the container, proximate (front, back, left, right) to the container, below the container, or in various compartments in any combination of the above mentioned positions.

The UV-C LED spot module may comprise a single condenser lens, an array of condenser lenses, a Fresnel lens, a curved reflector, a flat reflector, a non-imaging concentrator, a tapered light pipe or any combination thereof.

The module can include numerous kinds of fixation features, these can be screw holes, bayonet fixing features, a mounting flange or it can be simply pressed into a recess at a desired location.

In other examples, however, the device may simply comprise a light generating unit, adapted to be inserted or otherwise incorporated within external water storing or transporting components. For example, according to certain embodiments, the water purification device might comprise a perforated disk, having an array—or other arrangement—of mounted UV-C LED modules in accordance with the invention, for installing within a water supply pipe, or within a valve or ante-chamber disposed along the pipe, at a point in advance of the delivery of the water at a tap or tank. In other examples, the water purification device might comprise a mobile or 'handheld' device, for inserting into any chosen body of water to administer UV-C light.

In some embodiments, the one or more UV-C LED dies may comprise flipchip LED dies.

Flipchip LED dies are characterized in having the electrical contacts disposed on the opposite side of the die to the light emitting surface, and are typically electrically connected by soldering. LED dies comprise p (anode) and n (cathode) terminals on the same surface of the die, such that they may be mounted directly, with the emitting surface facing the substrate of the die—the substrate having electrical bonding points for making electrical communication with the terminals of the LED.

In the case of the present invention, the translucent window element(s) may play the role of the substrate, onto which may be coupled one or more flipchip LED dies.

In this case—or, indeed, according to any suitable embodiment of the invention—the one or more UV-C-translucent window elements may comprise electrical tracks for delivering current to one or more terminals of the one or more UV-C LED dies. This can be best thought of as chip-on-window packaging. The tracks may be connected to the terminals of the LED by wire-bonding, followed by, in some examples, encapsulation of the die and wires with a UV stable silicone, the encapsulation maximizes the optical output of the module and protects the module against corrosion and water.

The optical output can be increased by minimizing the number of optical interfaces and especially air gaps between the LED die and the exit window or by creating specific shapes like domes or other surface structures to increase extraction/outcoupling efficiency.

Further increases in optical efficiency can be achieved by the use of two different encapsulants, one reflective and one transparent. This increase is because the absorption of UV by the PCB is largely eliminated by the reflective encapsulant.

The UV-stable silicone, Teflon, or other organic coating may be applied by, for example, dispensing or moulding. The exit window then serves as an electrical carrier (substrate) having electrical conducting tracks to electrically connect to the die. The tracks may also connect, on the other side of the die, to a power source to drive the LEDs and may even include tracks for electronic components for driving the UV-C LEDs. This can be thought of as chip-on-window packaging. Power transfer from the power source to the LED can be for example, by wires or pins.

In another embodiment the module may be powered by inductive coupling, that is to say, the module may be powered by near-field wireless transmission of electrical energy between two magnetically coupled coils that are part of resonant circuits tuned to resonate at the same frequency.

Wireless transmission is useful to power electrical devices in cases where interconnecting wires are inconvenient, hazardous or not possible. In wireless power transfer, a transmitter device connected to a power source, such as the mains power or a LED driver, transmits power by electromagnetic fields across an intervening space to one or more receiver devices where it is converted back to electrical power and utilized. In case the transmitter and receiver are properly designed and positioned, power transfer efficiencies of above 95% may be obtained. The receiving antenna needs to be well aligned with the transmitting antenna and the distance between the receiving and transmitting antenna needs to be relatively small.

In a further example, the receiving antenna is integrated into a sucker, the sucker may be made from rubber and is used to fix the module in a desired position. Preferably, the cables forming the wireless receiving antenna are encapsulated within the sucker material, such that these wires cannot be in contact with the water in the container and also preventing any water leakage via the wires towards the LED module.

The sucker works by squeezing out the air (or water) between it and the surface on which the sucker is being pressed. The atmospheric pressure on the other side of the sucker holds the rim of the sucker firmly against the surface and the rim forms an airtight (or watertight) seal with the surface so that no air or water can return behind the rubber and there is an area of lower pressure inside the sucker than outside.

Inductively powered UV-C modules can be placed directly inside a water container, for example, a water container of a consumer device, to provide a fast and hassle free solution as the water container is often designed to be removable and refillable by the user. The wireless power transfer removes the need for a cable connection from the container towards a power supply in the housing of the consumer device and also removes the risk of water leakages from the container or pollution caused by the cable inside the container or even by micro-organisms growing on the cable itself within the water container.

The structure of the modules may be such that the bottom surface of the one or more UV-C LED dies comprises a surface of a light-transmitting substrate layer, and said bottom surface is in optical communication with the associated UV-C-translucent window.

In this way, the bottom of the LED die is attached to the translucent window, for example using a flip chip bonding process.

The one or more UV-C-translucent window elements may comprise a translucent ceramic. Translucent ceramics, such as Philips Uden translucent ceramics made of $Al_2O_3$, are known to have high transmission-to-reflection ratios at their boundaries, and additionally are well suited to the flipchip bonding of dies described above.

The one or more UV-C LED modules may further comprise a water-resistant and water-tight encapsulation. Water resistant and water-tight encapsulation allows a purification device having LED modules arranged such that they may be directly submerged within the water to be administered. This has the additional benefit that the number of optical interfaces between the UV-C emitting die or package and the water volume is minimized.

In one example, a watertight seal may be achieved by soldering an UV-C transparent ceramic or transparent optical element onto a ceramic substrate. This achieves a watertight module since these materials do not exhibit water vapor transmission. This means that no condensation of water can take place inside the created cavity between the optical window and the ceramic substrate thus eliminating the risk of corrosion. Organic materials generally display quite high water vapor transmission rates (WVTR) making them unsuitable for use. According to some embodiments, the one or more UV-C-translucent window elements may be for transferring heat from the one or more UV-C LED dies. Solid coupling of the LED dies to the window element allows the window to act as a heat sink as well as an optical component. This greatly enhances the cooling efficiency of the device in comparison with devices comprising LEDs disposed within cavities, wherein heat cannot be conducted between the die and the window, but must instead be conducted through an under-substrate heat sink, or through the substrate itself.

According to some embodiments a water resistant, UV-reflective and biocompatible heat sink is connected to the water container wall. The heat sink is a non-metallic, thermally conductive, UV reflective material such as Boron Nitride (BN) filled UV resistant silicone or fluoropolymers. The thermal conductivity is preferably above 1 W/mK. In a further embodiment the top surface of the heat sink could be metallized with a thin layer of copper to increase the thermal conductivity.

The main path for heat removal in LEDs under normal conditions is via the contact pads and substrate to an optional heat sink, such heat sinks are often made from aluminium or other rigid metals. These heatsinks are not conformable to the inner surface of the water container and nor are they suitable for long-term contact with potable water. The upper side of the LED is hardly used for cooling as it is surrounded by air which has a poor thermal conductivity of approximately 0.26 W/mK compared with that of water, approximately 0.6 W/mK.

The cooling of electrical components can be improved with potting but that is not suitable for covering the LEDs as potting material is not light transmitting. This is a particular problem for UV-C as there are hardly any suitable materials which do not exhibit residual absorption. A UV-C module may be potted with a food grade silicone or polyurethane (PU) to ensure water tightness and to improve thermal performance. However, this potting is not applied in front of the LEDs.

A floating heat sink is suitable for the embodiments containing a watertight UV-C module. The heat sink can easily be enlarged to provide adequate cooling for different power levels of the UV-C module.

According to the embodiments that have the LED die coupled to the associated window element there are different coupling options.

According to a first coupling example, there may be provided an adhesive between each UV-C LED die and the associated UV-C-translucent window element. In this case, the two are solidly coupled via the adhesive layer, and light emitted by the die may—at least partially—be transmitted to the associated window element via the intermediary adhesive layer.

According to a second coupling example, the one or more UV-C LED dies is at least partly embedded in the associated UV-C-translucent window element. In this case, the two components make direct physical contact, with the light emitting surface(s) of the former physically meeting surface(s) of the latter. This arrangement hence affords the greatest light transmission efficiency, since no intermediary layers are required between the surfaces of the two components. Additionally, this arrangement maximizes heat conduction efficiency, since through embedding the die within the window, a greater proportion of the external surface area of the former is in thermal communication with the latter.

Within this—or any other—embodiment, there may further be provided a sealing layer, said layer disposed over either the top or bottom surface of the, or each, UV-C LED die. This layer may, for example, be UV-C light-reflective, thereby allowing at least a portion of any 'backwardly' directed light to be recycled and re-transmitted in the direction of the output window. The sealing might additionally be water resistant in some examples.

According to an aspect of the invention, there is provided a water purification method, comprising:

administering UV-C light to a body of water, the UV-C light being generated by one or more UV-C LED modules, each module comprising:

one or more UV-C LED dies, each die having a bottom surface and a top surface, and one or more UV-C-translucent window elements, wherein each of the UV-C LED dies is solidly coupled against an associated UV-C-translucent window element, such that at least one of the bottom or top surfaces of the die is in optical communication with the UV-C-translucent window element.

According to another aspect of the invention, there is provided a method of producing a water purification device, comprising:

solidly coupling one or more UV-C LED dies against one or more UV-C-translucent window elements, each UV-C LED die having a bottom surface and a top surface, and the coupling being such that such that at least one of the bottom or top surfaces of each UV-C LED die is in optical communication with an associated UV-C-translucent window element, said coupling thereby generating one or more UV-C LED modules for administering UV-C light to a body of water.

The coupling of the one or more UV-C LED dies to the associated UV-C-translucent window elements may comprise, in some embodiments, at least partially embedding the UV-C LED die into a surface of the associated UV-C translucent window element. In this case light emitting surface(s) of the die makes direct physical contact with surface(s) of the window element.

Additionally, in some embodiments, the method may further comprise providing a sealing layer disposed over a surface of each of the one or more UV-C LED dies.

This layer may, for example be UV-C light reflective and/or water resistive.

According to another embodiment, there is provided a method of manufacturing a watertight UV-C LED module, comprising;

printing conductive tracks on the ceramic substrate and the ceramic exit window, optionally printing the conductor coil (for inductive coupling of power), sintering the ceramic parts, attaching the LED die (this can be achieved with conductive/non conductive glue or soldering), optional coil placement (for inductive coupling of power), wirebonding, soldering the two parts together.

In another embodiment of the method, the conductor tracks could be part of a small flex substrate that is attached to the ceramic substrate or alternatively they could be discrete stamped/etched conductive parts that are attached to the ceramic substrate.

BRIEF DESCRIPTION OF THE DRAWINGS

Examples of the invention will now be described in detail with reference to the accompanying drawings, in which:

FIG. 10$b$ shows a consumer product comprising a UV-C LED positioned inside the water container.

FIG. 13 shows an embodiment with a UVC LED die mounted on an IMS PCB

DETAILED DESCRIPTION OF THE EMBODIMENTS

Figure 1:
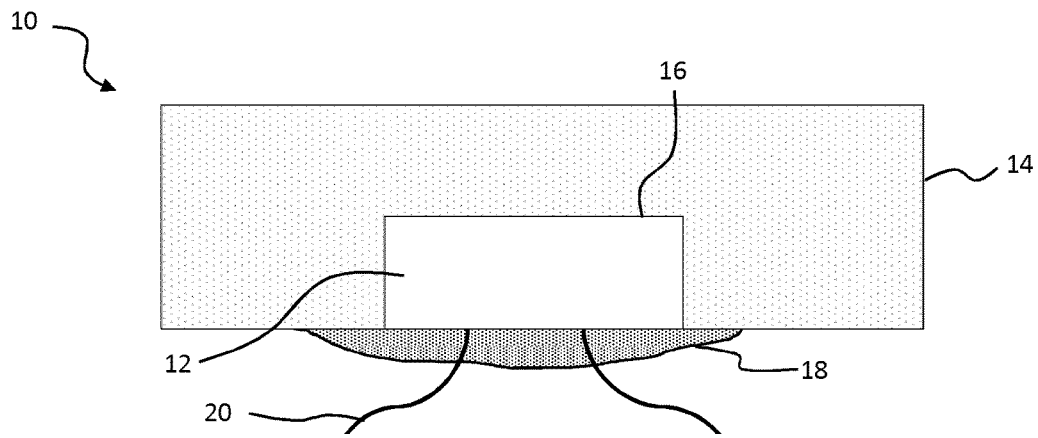
FIG. 1 shows a first example UV-C LED module, for administering of UV-C light to water to be purified.

The invention provides methods and apparatus for ultraviolet (UV) water purification, comprising UV-C LED modules having improved light extraction efficiency. UV-C LED dies are solidly coupled to associated translucent output windows, such that light is transmitted directly from light-emitting surface(s) of the dies to output window(s) of the LED package—without propagation across interstitial air gaps. Gas-to-solid (and solid-to-gas) light transition boundaries are thus eliminated, significantly reducing the amount of light lost through inter-medium boundary reflection, and thereby increasing efficiency of light extraction.

Use of UV light—in particular UV-C light—for the sterilization of water is well known. UV light at sufficiently short wavelengths is mutagenic to bacteria, viruses and other micro-organisms. At a wavelength of 2,537 Angstroms (254 nm), UV breaks molecular bonds within micro-organismal DNA, producing thymine dimers in the DNA, thereby destroying the organisms, rendering them harmless or prohibiting growth and reproduction. Ultraviolet disinfection of water consists of a purely physical, chemical-free process. UV-C radiation attacks the vital DNA of the bacteria directly. The bacteria lose their reproductive capability and are destroyed. Even parasites such as cryptosporidia or giardia, which are extremely resistant to chemical disinfectants, are efficiently reduced.

Most typically, germicidal ultraviolet light is delivered by a mercury-vapor lamp, which emits UV light at the germicidal wavelength (mercury vapor emits at 254 nm). The UV units for water treatment consist of a specialized low pressure mercury vapor lamp that produces ultraviolet radiation at 254 nm, or medium pressure UV lamps that produce a polychromatic output from 200 nm to visible and infrared frequencies. Medium pressure lamps are approximately 12% efficient, whilst amalgam low-pressure lamps can be up to 40% efficient. The UV lamp never directly contacts the water, but is housed inside a glass quartz sleeve, submerged in the water, or else mounted external to the water.

Due to the large form factor, inflexible operating mode, and hazardous compositional materials, increasingly attention has turned toward the use of UV-emitting LEDs within water purification devices. It is well known that group IIIA-nitrides ($Al_xGa_{1-x-y}In_yN$, [$0</=x+y<1=1$]) have direct band gaps which can be used to generate electromagnetic radiation in the ultraviolet wavelength range. However, efficiency of UV LEDs remains an on-going concern, with the ceramic cavity packaging of most typical LEDs leading to the loss of significant portions of light due to reflection at exit-window boundaries.

The reduced efficiency of LEDs causes practical deficiencies for water purification devices utilizing the technology. In particular, it means that devices incur a greater power consumption than would otherwise be necessary, and/or a greater density of LED modules must be incorporated within a device, for a given provided drive voltage. The improvement of LED package efficiency is therefore of pressing concern.

The present invention provides a water purification device comprising LED modules having improved light extraction efficiency. FIG. 1 shows a first example UV-C LED module 10 as comprised by embodiments of the invention. A UV-C LED die 12 is solidly coupled to a translucent window element 14, such that a top (light-emitting) surface 16 is in optical communication with a surface of the window element. At the base of the LED die, covering its bottom surface, and partially covering the bottom surface of the translucent window is a sealing layer 18. The sealing layer may for example comprise a UV-C reflective material, such that any light back-reflected from the top (light-emitting) surface 16 of the die may be at least partially conserved by re-reflection in the direction of the light emitting surface 16. The sealing may, in certain embodiments, additionally or alternatively, comprise a water resistive sealing, adapted to inhibit the communication of water with the semiconductor layers, or other elements, of the UV-C LED die. The sealing may also help prevent the transport of water into or through any crevices or gaps which may exist between the surfaces of the die and the respective touching/engaging surfaces of the window element.

By way of non-limiting examples, the sealing layer 18 may be a UV resistant organic material, silicone or silicone composites, a fluoropolymer or its composites. The sealing layer may for example be applied by dispensing or transfer moulding, although it will be clear to the skilled person that other application techniques may also be used.

Translucent window element 14 may, by way of non-limiting example, be composed of Polycrystalline Alumina (PCA) materials, such as for example Spinel ($MgAl_2O_4$), AlON, or sapphire. However, other suitable translucent ceramic materials may also be used.

In this example, electrical connection to the LED die is made through the sealing layer 18 by connection wires 20. These may connect to the top of the LED die so that the LED die substrate is flush against the translucent window, and the LED die is then a bottom emitting structure. Equally, the LED die may be a top-emitting structure with its substrate vertically displaced from the bottom surface of the translucent window 14, and connection wires connected to terminals provided on said substrate layer. In either case the light emitting surface of the die is mounted flush against, and facing in towards, a surface of the translucent window, and electrical connection wires are connected to terminals provided on the opposite side.

In the example of FIG. 1, the LED die 12 is coupled with the translucent widow element 14 such the die is embedded within the body of the window element 14. In this way, the light-emitting top surface 16 of the die (and additionally the side surfaces) is (are) in direct physical contact with surfaces of the translucent window element. As a result, light exiting the top surface 16 of the die may be transmitted directly to the corresponding engaging surface of the window element, without propagating through any intermediary or interstitial layers. At the transition boundary between any two light-propagating media, having refractive indices which are not identical, a portion of incident light is always reflected. Most or all such reflected light is lost to the overall luminance of the die and hence the minimization of media layers through which exiting light must travel, helps to maximize the total proportion of generated light which is eventually emitted from the device. Minimizing intermediary layers, therefore, enhances overall light extraction efficiency.

The translucent window element 14 has the effect of increasing the effective size of the optical source. The light scatters in the translucent material and escapes from the facets of the window element 14. Absorption of light is avoided (since the window element is translucent rather than opaque) thus preventing energy loss to heating.

The above described arrangement, as embodied by the example of FIG. 1, may be compared with LED package arrangements of prior art UV-C devices. In these devices, typically a UV-C LED die is disposed within a non-reflective ceramic cavity, the cavity being capped by a glass (quartz glass, sapphire or fused silica) exit window. The light emitting surface of the LED die in this case is separated by an air gap from the lower surface of the overhanging glass window. Hence, light exiting the top surface of the LED die must propagate across an interstitial air layer before entering the window element above. As a result, two gas-solid transmission boundaries must be crossed by the light in order to exit the cavity. Since gasses, such as air, typically have a lower refractive index than solids, such as glass or ceramic, these transition boundaries incur a greater reflection-to-transmission ratio, and hence a greater loss of useful light. Additionally, since the cavities are typically non-reflective, light reflected at the boundary between the air gap and the glass exit window is almost entirely lost through absorption at the walls of the surrounding cavity.

Although in the example of FIG. 1, the die is embedded within the bulk of the window element (by, for example, mounting the die within a cavity formed in the window), such that all but one of its sides are entirely covered by respective engaging surfaces of the window element, in other examples, the UV-C LED die may be only partially embedded within the window element, leaving a portion of its side surfaces exposed or uncovered. In this case, the sealing layer 18 might additionally partially cover the exposed portions of the LED die side surfaces.

In simpler examples still, the solid coupling between the LED die and the translucent window element may not comprise embedding at all, but rather the two may be solidly adhered via an intermediary adhesive layer. While an intermediary layer between the two components introduces additional media transition boundaries for exiting light to cross, and thereby increases the total amount of light lost to reflection, since an adhesive layer is solid and not gaseous, the refractive index disparity between the connecting media is significantly less than in the prior art cavity arrangement described above. Consequently, the transmission-to-reflection ratio is significantly higher, and light extraction efficiency still greatly improved. In certain cases, an adhesive coupling may be preferred to embedding, for example for reasons of reducing production cost or simplifying fabrication processes.

The window element may in certain embodiments provide a heat dissipation function for the coupled LED die(s). Since the window is in physical communication with the coupled die, heat may be conducted away from the die, and dissipated into the surrounding environment. This contrasts with the prior art arrangements, wherein the window element is separated from the LED die(s) by an insulating air space, making heat extraction via the window extremely inefficient. Instead, an additional dedicated heat sink may typically be required, disposed beneath the LED packages, in thermal communication with the dies. The present invention allows for efficient heat dissipation, without the requirement for dedicated heat-sink components.

In certain embodiments, the translucent layer might comprise a translucent ceramic. Translucent ceramics, such as Philips Uden translucent ceramics, such as Polycrystalline Alumina (PCA) as one non-limiting example, are known to have high transmission-to-reflection ratios at their boundaries.

Figure 2:
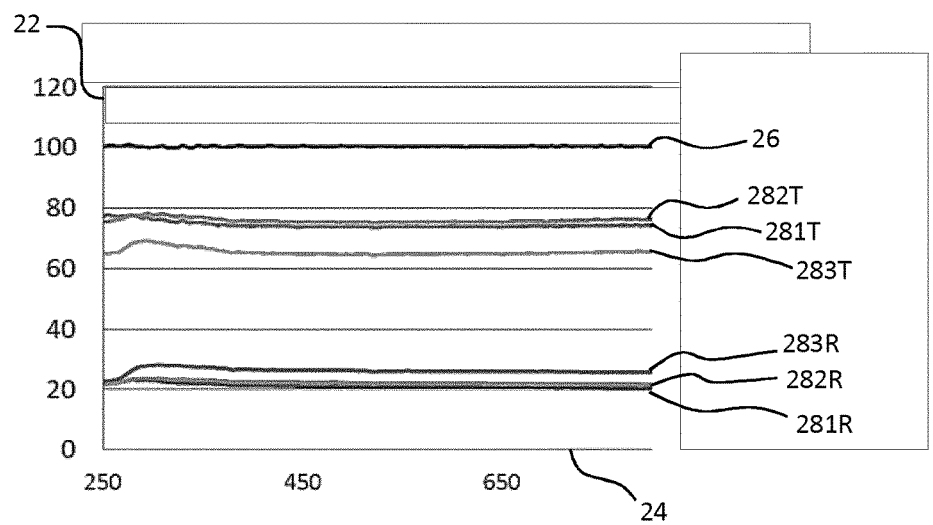
FIG. 2 shows a graph illustrating reflection and transmission rates of a range of example translucent ceramics, at a range of UV wavelengths.

FIG. 2 shows a graph illustrating the percentages of light respectively reflected and transmitted at the boundary of three example translucent ceramic (PCA) layers, each comprising the same material but formed at different thicknesses.

The y-axis 22 represents light percentage either reflected or transmitted, and the x-axis 24 represents the wavelength of incident light, in nm. Line 26 represents the reflection percentage of a reference window having zero reflectivity. Lines 281R and 281T represent the reflection and transmission percentage respectively of a ceramic layer having thickness 0.8 mm. Lines 282R and 282T represent the reflection and transmission percentages respectively of a layer of thickness 1.0 mm. Lines 283R and 283T represent reflection and transmission percentages respectively of a ceramic layer of thickness 1.5 mm.

As can be seen from the graph, thicker layers give rise to very slightly higher reflectivity percentages. However, all thicknesses have reflectivity percentages at or below approximately 30% across a broad range of wavelengths.

Figure 3:
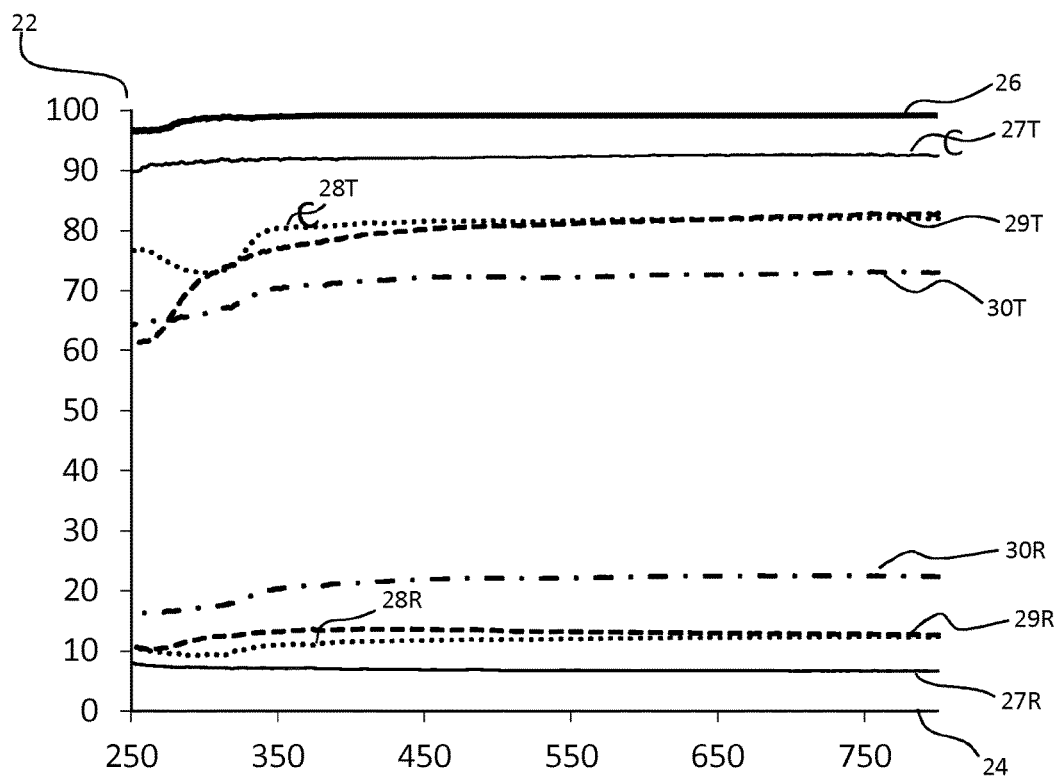
FIG. 3 is shown a second graph, illustrating the percentages of light respectively reflected and transmitted at the boundary of three example translucent ceramic layers.

In FIG. 3 is shown a second graph, illustrating the percentages of light respectively reflected and transmitted at the boundary of three example translucent ceramic layers, each comprised of a different example ceramic material. Each one is a polycrystalline alumina (PCA) but synthesized using different conditions such as powder sizes, temperature etc. Also shown on the graph, for reference, are the respective reflection 27R and transmission 27T percentages of a quartz layer.

Again, the y-axis 22 represents light percentage either reflected or transmitted, and the x-axis 24 represents the wavelength of incident light, in nm. As in FIG. 2, line 26 represents the reflection percentage of a reference window having zero reflectivity. Lines 28R and 28T represent the reflection and transmission percentage respectively of a first example ceramic layer composed. Lines 29R and 29T represent the reflection and transmission percentage respectively of a second example ceramic layer. Lines 30R and 30T represent the reflection and transmission percentage respectively of a third example ceramic layer.

As can be seen from the graph, all of the example translucent ceramic materials have reflectivity percentages below approximately 22%, with two out of the three exhibiting reflectivities of below approximately 12%. These values compare very favorably with quartz, as known from prior art devices, which achieves a reflectivity only very slightly lower, for example, at the wavelengths optimal for DNA absorption (~260 nm).

Figure 4:
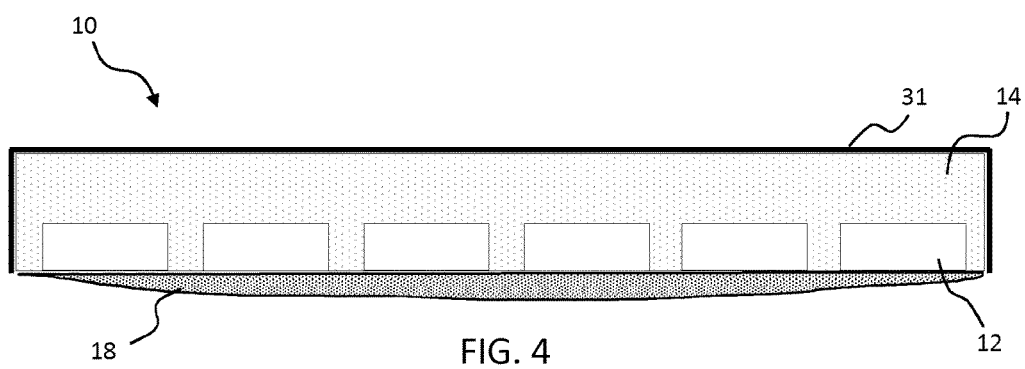
FIG. 4 shows a second example UV-C LED module, the example comprising a plurality of UV-C LED dies, and a water resistant encapsulation.

UV-C LED modules, according to embodiments of the invention, may comprise multiple LED dies coupled to a single translucent window element. FIG. 4 shows an example of such a module. A plurality of LED dies 12 are embedded within the body of translucent window element 14. Along the base of the row of dies is a sealing layer 18, covering the bottom surfaces of each of the dies, and additionally covering the bottom surfaces of the window element portions separating the respective dies. In alternative examples, sealing might be provided for covering each die individually, without additionally spanning the spaces or gaps between embedded dies. In further examples still, no sealing may be provided at all.

As in the example of FIG. 1, sealing 18 might be UV-C light reflective and/or water resistant. The example UV-C LED module of FIG. 4 also comprises a waterproof encapsulation 31, which might comprise a water resistant layer disposed about the external boundaries of the window element, or might, for example, comprise an additional structure or housing, constructed surrounding the window element. The housing may be produced using the Sol-gel process. The Sol gel process is a process for producing solid materials from small molecules. The process involves the conversion of monomers into a colloidal solution that acts as the precursor for an integrated network of either discrete particles or network polymers. The solution gradually evolves towards the formation of a gel like system containing both a liquid phase and a solid phase. This can be accomplished in any number of ways, the simplest method is to allow time for sedimentation to occur and then to pour off the remaining liquid. Centrifugation can also be used to accelerate the phase separation process.

Removal of the remaining liquid (solvent) phase requires a drying process. This is typically accompanied by a significant amount of shrinkage and densification. The rate at which the solvent can be removed is ultimately determined by the distribution of the liquid within the gel. The ultimate micro-structure of the final component will clearly be strongly influenced by changes imposed upon the structural template during this process phase.

After the drying process, a thermal treatment such as sintering is often necessary in order to further enhance mechanical properties and structural stability. One advantage of this process over more traditional processing techniques is that the densification is often achieved at a lower temperature, another advantage is that the process is relatively cheap and allows for the fine control of the product's chemical composition. Even small quantities of dopants, such as boron nitride can be introduced into the sol-gel and end up being unifoprmly dispered in the final product.

Another embodiment of the invention uses a housing that is manufactured from pressed glass-160, alternatively the housing may be cheaply manufactured from an extruded tube of glass-160.

In certain embodiments of the invention, the one or more UV-C LED modules might comprise planar arrays of LED dies embedded within—or otherwise solidly coupled to—a single translucent window element. The array of LED dies may be chosen having a particular density, or array 'pitch', in accordance with a desired output intensity or luminance of the module. In the case of such an array of dies, it may be desirable in certain embodiments that the window element comprise electrical tracks which run along its bottom surface, for the purpose of delivering current to terminals of embedded or coupled LED dies. According to such an example, an additional board for electrical mounting of the LED dies is rendered unnecessary, since the window element itself plays the role of a PCB.

In this, or other, embodiments, the UV-C LED dies might comprise flipchip UV-C LED dies. Flipchip LED dies are characterized by having both electrical contacts disposed on the same side of the die—in particular, on the opposite side of the die to the light-emitting surface. Both p and n terminals of a flipchip die are disposed at the bottom surface of the die, and hence electrical tracks need only be provided to one side (top or bottom) of each die. This allows for the dies to be embedded within, or otherwise coupled to, the window element, as shown in FIGS. 1 and 4, for example, without the need to provide electrical wires running through portions of the window element in order to reach terminals on a top surface of the die.

Figure 5:
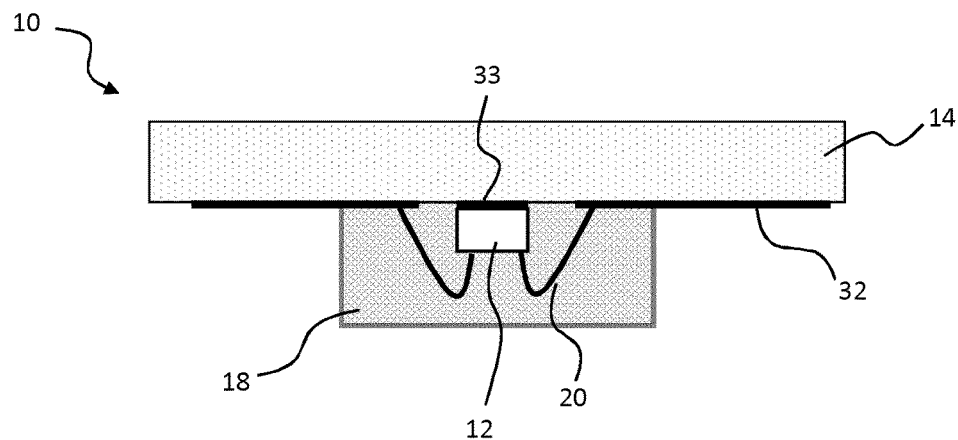
FIG. 5 shows a third example of a UV-C LED module for administering of UV-C light to water to be purified.

In FIG. 5 is illustrated a first example of electrical bonding arrangements for an example UV-C LED module 10 comprising a flip-chip bonded UV-LED die 12 and conductor tracks 32 provided to the bottom surface of the translucent ceramic window 14. The UV-C LED die is solidly coupled to the bottom surface of the translucent window via a layer of adhesive 33, and is coupled such that the light-emitting surface of the die is facing against the bottom surface of the window. At the opposite side of the die to the light emitting surface are (anode and cathode) contact terminals, to which are soldered (or by any other means adhered/connected) wirebonds 20. The wirebonds provide electrical connection between the terminals of the die 12 and conductor tracks 32 provided on the bottom surface of the translucent window 14, for delivering drive current to LEDs disposed on the window. The conductor tracks comprise electrical contact points for both the wirebonds, and a driving electrical power source. The LED die is encapsulated with UV-C (and, in some embodiments, water) resistant sealing layer 18, applied by, for example, dispensing or transfer moulding.

In examples, an array of UV-C LED dies may be coupled to a common window element 14, and electrical tracks 32 provided on the bottom surface of the window for driving each die, therefore creating a multi-die UV-C LED module. In this case, the ceramic window acts as an electrical carrier, or effective PCB for the coupled LED dies.

Figure 6:
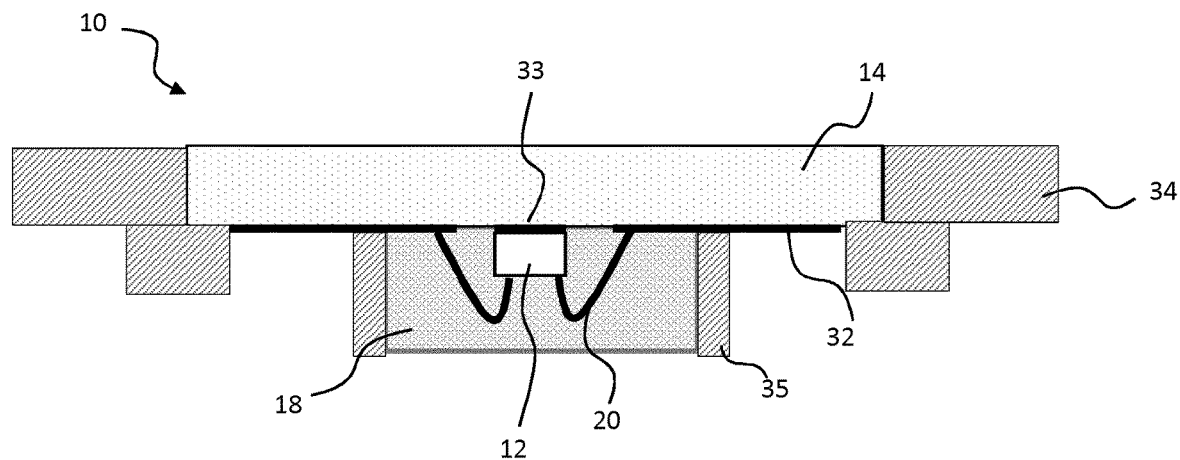
FIG. 6 shows a fourth examples of a UV-C LED module for administering of UV-C light to water to be purified.

According to some examples, as illustrated in FIG. 6, the UV-C module 10 may be further mounted within a surrounding metal (or other suitable material, as will be clear to the skilled person) mounting ring 34. The mounting ring, may, by way of non-limiting example, be formed through a moulding process. FIG. 6 also shows a cavity wall which is dispensed or molded around the LED die 12 for containing the encapsulation.

Figure 7:
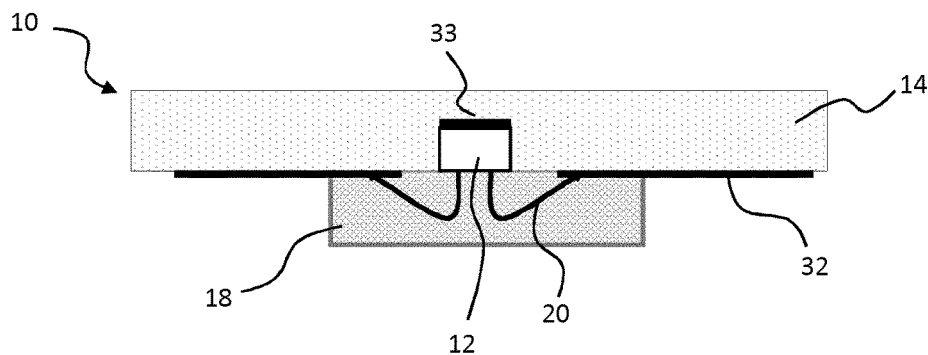
FIG. 7 shows a fifth example of a UV-C LED module for administering of UV-C light to water to be purified.

According to further examples, as illustrated by FIG. 7, the UV-C LED die may be partially or fully embedded within the body of the ceramic window 14, for example disposed within a cavity formed in the body of window 14. The die in this case, may be adhered within said cavity by way of a layer of adhesive 33 provided between the top (light-emitting) surface of the die and the top surface of the formed cavity. Sealing layer 18 is then formed over the bottom surface of the die to provide UV-C (and, in some embodiments, water) resistant encapsulation.

In some embodiments, the water purification device might comprise pluralities of UV-C LED modules—each comprising either an array of dies, a single row of dies, or an individual die—arranged or assembled within a broader LED module assembly. Such an assembly might, for example, comprise a board for physical mounting of the various LED modules, for facilitating a particular orientation or light propagation direction. The assemblies might further comprise for example a water resistant encapsulation, so as to allow for submerging said assemblies into a body of water, for administering doses of UV light. This water resistant encapsulation might in certain examples be provided in addition to water resistant encapsulation provided for individual LED modules, or in other examples might be provided instead of individual module encapsulation. The assemblies might in some examples comprise additional optical elements, such as converging lenses, collimating lenses or other beam-shaping elements.

Figure 8A:
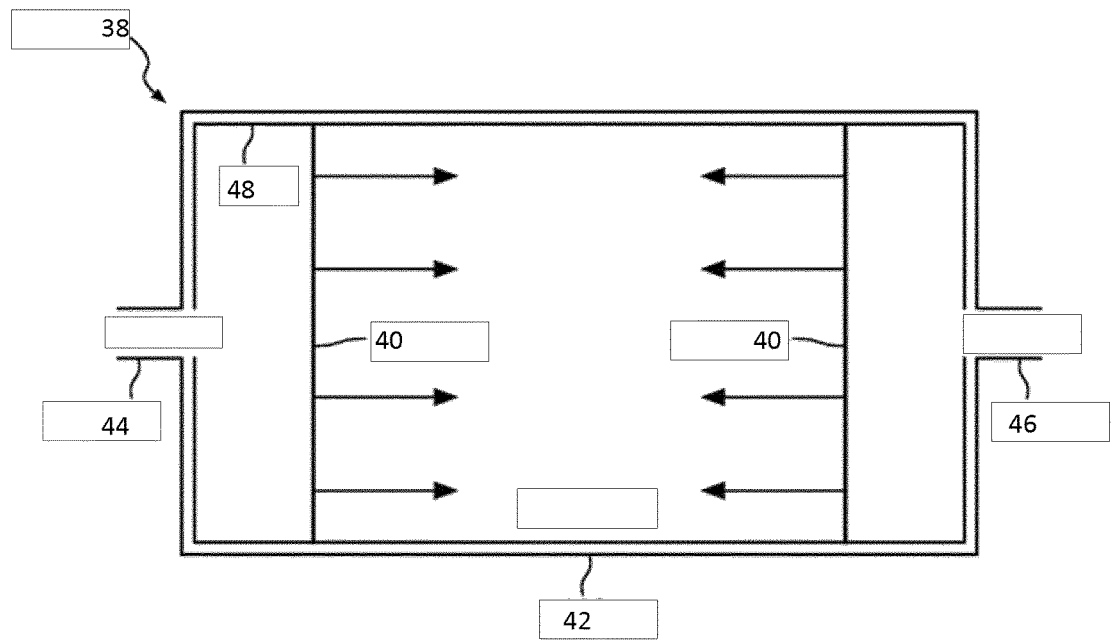
FIGS. 8($a$) and 8($b$) show an example water purification device comprising a UV-C light-emitting perforated disk for installation within a pipe or water chamber.
Figure 8B:
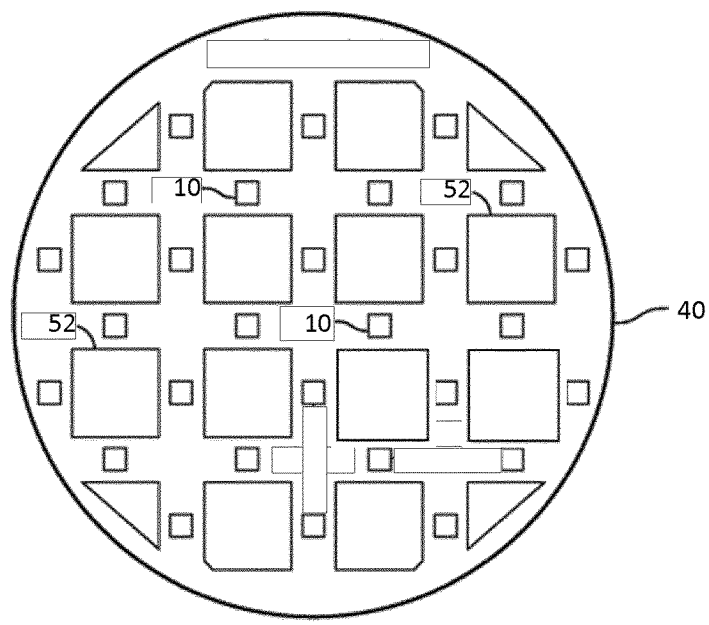

FIGS. 8(*a*) and (*b*) show a first example embodiment of a water purification device in accordance with the invention, incorporating the UV-C LED modules in accordance with one or more of the examples described above. FIG. 8(*a*) shows a water purification system 38, wherein two perforated plates 40 are housed inside a chamber 42, the perforated plates comprising a plurality of mounted UV-C LED modules for the administering of UV-C LED light. In other examples, the perforated plates might comprise mounted assemblies of pluralities of UV-C LED modules, the assemblies comprising additional supporting structural components, or optical elements for example. In an embodiment of the invention, perforated plates 40 may be modified to fit into any other container or conduit. For example, the perforated plates might be adapted to fit into a cylindrical pipe, carrying water.

The chamber 42, in the example shown in FIG. 8(*a*), has an inlet 44 and an outlet 46. Water enters the chamber 42 through inlet 44 and passes through perforations in perforated plate 40. Microorganisms present in the water, while passing through the perforations in the perforated plates, are exposed to UV-C radiation emitted by the UV-C LED modules mounted on, or within, the perforated plates. The UV radiation is absorbed by the DNA, RNA and protein in the micro-organisms, causing genetic disorder and inactivation of the microorganisms. The perforated plates expose both the front and rear of the micro-organisms to radiation as the water passes from one side of the plate to the other, maximizing the overall sterilization efficiency of the purification device.

In certain examples, a feedback-based power control unit and feedback units may be employed to control the total power delivered to the LED modules (not shown in FIG. 8(*a*)). The feedback units might provide data to the feedback-based power control units concerning the physical properties of the water to be purified (viscosity, color or cloudiness, for example). On the basis of the received data, such a control unit may then vary the total power supplied to the LED modules thereby allowing for optimal energy consumption for a given microbial concentration within the water.

In certain examples, the system 38 may comprise UV-reflecting screens 48 covering one or more walls of the chamber 42. Any UV radiation incident on UV-reflecting screens 48 is reflected back into the body of the chamber, thereby increasing the intensity of UV radiation within the chamber, and increasing the sterilization efficiency of the system.

FIG. 8(*b*) shows a front view of perforated plate 40, comprising UV-C LED modules 10 mounted on its surface. The mounted LED modules in one example comprise an array of LED dies coupled to a single translucent window element, as in the example illustrated by FIG. 4, or in another example might comprise an array of modules, each coupled to an individual, isolated window element. The perforated plate 40 has perforations 52 to allow water to pass across the surface of the plate. Perforations may be provided at a larger or smaller relative size, depending on the desired water flow rate, and depending upon the required surface space for mounting the desired concentration of LED modules.

Figure 9:
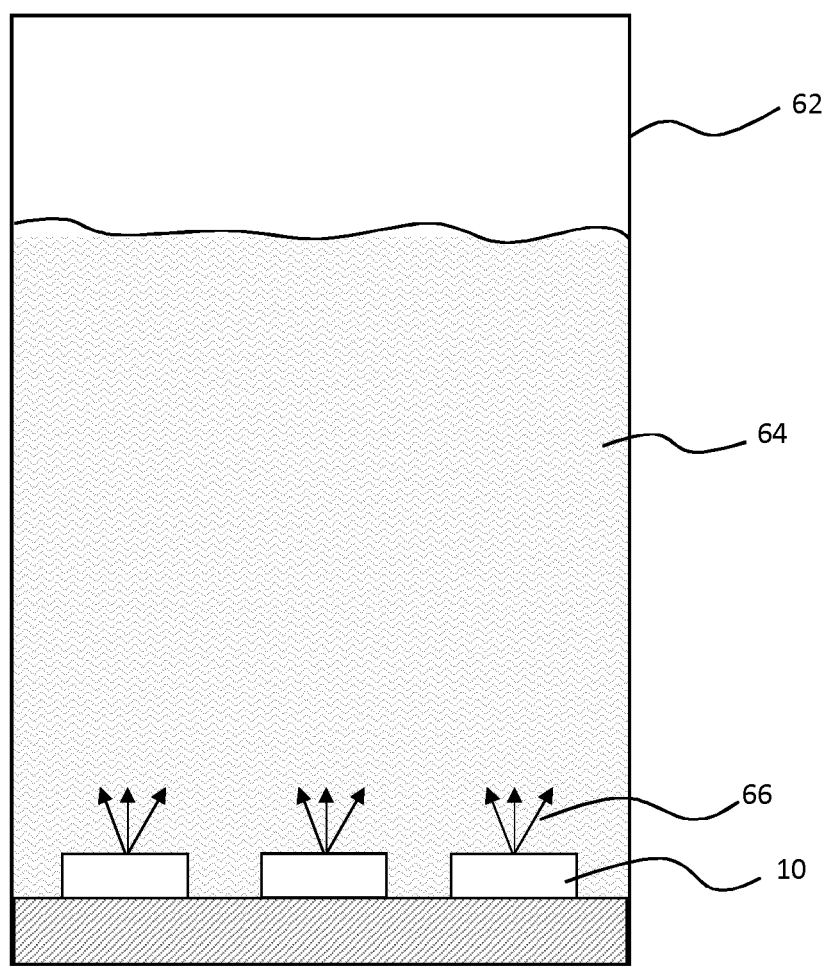
FIG. 9 shows a second example water purification device comprising a water-containing vessel having UV-C LED modules disposed within its base.

In another embodiment of a water purification device in accordance with the invention, the device comprises a vessel for containing a body of water to be purified, and comprise a plurality of UV-C LED modules in accordance with the examples described above, disposed within or mounted outside the vessel, for the administering to the contained water, doses of UV light. In FIG. 9 is shown a simple example of such an embodiment, wherein a vessel 62, for containing a body of water 64 houses one or more UV-C LED modules 10 for the delivery to the water of a dosage of UV-C light 66. In the example shown, the modules are mounted to a base supporting structure of the device, and disposed within the walls of the vessel, submerged within the body of water to be purified. In other examples however, the LED modules might not be submerged, but rather disposed within or just outside the walls of the vessel, for example. The walls may in this case comprise a UV-transparent material, such that light from the modules may penetrate into the contained water, but without making fluid contact with the water.

In some examples, the embodiment of FIG. 9 might comprise assemblies of single or multiple LED modules in accordance with the examples described above, these assemblies, for example, comprising additional supporting structures for angling the LEDs to generate light at a particular range of propagation angles. The assemblies might additionally comprise optical or other beam-shaping elements.

In another embodiment of a water purification device, in accordance with the invention, the device might comprise a hand-held, or otherwise 'mobile' purification device, comprising pluralities of UV-C LED modules in accordance with the above described examples. The mobile device might, for example, be adapted for manual insertion into any desired water-containing vessel, upon which the modules—or assemblies of modules—are stimulated to deliver a desired dose of UV-C radiation to the contained water. The device might for example comprise a 'wand'-like structure, for easy insertion into a range of different vessels. The device might comprise various safety features, for the protection of a user from UV radiation exposure. For example the device might comprise an upper shield, having a UV-reflective or absorptive surface, for either deflection or capture of incident radiation. The device may comprise a sensor, such a sensor may be an infra-red sensor to sense body heat. When body heat is sensed then the device may be powered down.

The invention further provides a method for producing a water purification device in accordance with one or more of the device embodiments described above. According to one or more embodiments of this method, a UV-C LED module in accordance with any of FIGS. 5-7 is produced for administering UV-C light to a body of water. In examples of these embodiments, conductor tracks 32 are first formed on the bottom surface of translucent window element 14 by, for example printing, moulding, patterning or any other suitable method. The tracks may comprise, for example, two or more common rails, running adjacent to one another in a first direction, the rails having mutual pairs of die-connector tracks extending from them in a second direction, each pair running to a central space in between the rails, the space for mounting an LED die.

Once tracks are formed, a plurality of UV-C LED dies are mounted, or coupled, to the bottom surface of the translucent window element, in the dedicated spaces to which connector tracks have been run. The dies may be coupled by, as in the examples of FIGS. 5 and 6, adhering the dies to the bottom surface of the window using a layer of adhesive 33, the light-emitting surface of the dies facing against said surface of the window. In other examples, as in the example of FIG. 7, the dies may be coupled to the window by first forming a cavity in the window in the dedicated space for mounting—this being done either before or after the forming of the electrical tracks 32—and then mounting the die within the cavity using a layer of adhesive to ensure secure coupling. In other examples still, the die may be embedded within a cavity in the window without the use of an adhesive layer, and hence avoiding the sacrificing of light by reflection at the boundaries between adhesive and die/window.

After the mounting of dies to the window, (anode and cathode) terminals of dies are connected to conductor tracks 32 by wirebonds 20, the wirebonds affixed at each end by, for example, soldering. Following this, encapsulation layer 18 is formed over at least each die, through for example the forming of a Silicone and BN glob top by, for example, dispensing or transfer moulding.

In some cases, a backside reflector element may also subsequently be formed over the entire bottom surface of the window element, by, for example deposition or moulding of a surface layer of reflective material. This performs the function of allowing recycling of at least some of the light which is back-reflected at the boundaries between material layers.

Figure 10A:
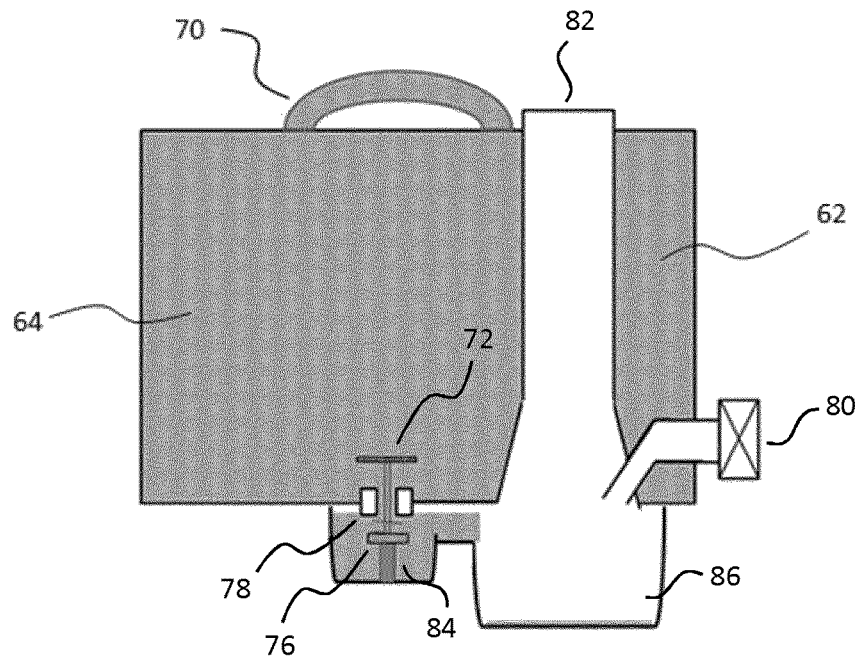
FIG. 10$a$ shows a consumer product comprising a water containing vessel having UV-C LED modules aimed at an exit valve.

FIG. 10a shows a water vessel 62 of an air humidifier. When the water vessel 62 is empty, a user may lift the vessel using the handle 70 to refill the vessel with water via a screw in plug (not shown). When the refilled vessel 62 is lifted using the handle 70, a spring (not shown) in a valve 72 pushes a valve stem 74 against a seat 78 in the valve body 76 and closes the valve preventing the flow of water.

When the user places the vessel 70 back into the humidifier, a pin 84 presses the valve stem 74 upwards away from the valve seat thus allowing water to flow through the valve into the humidifier chimney 86.

Figure 10B:
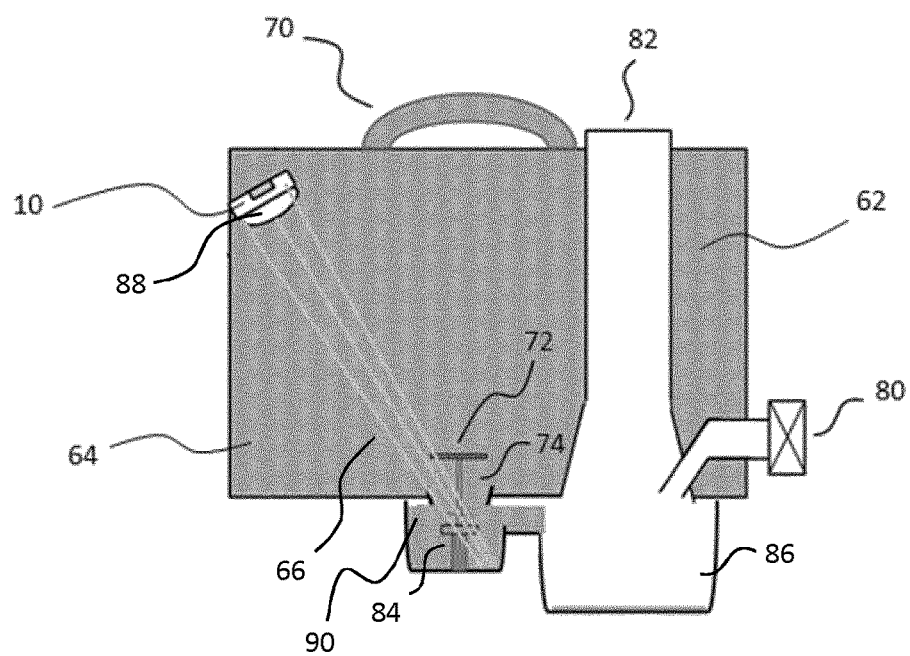

FIG. 10b shows a UV-C LED module 10 positioned inside the vessel 62. The LED module 10 is located at the top of the vessel and comprises optical means 88 such as a condenser lens to focus the UV-C light 66 towards a spot located at the bottom of the vessel, in this case the UV-C is focused towards the exit valve 72. The optical means 88 is manufactured from a UV-C transparent material having a refractive index higher than water (n>1.45), quartz is a suitable material.

The exit valve 72 has UV-C reflective walls, this may be applied as a coating to a non UV-C reflective material or alternatively the walls may be manufactured from a material that is UV reflective such as aluminium. These walls define a second, smaller, vessel 90 below the main vessel 62. The UV-C light 66 enters the second vessel 90 and is reflected around the inside of the vessel. This means that the efficiency of the system increases as the UV radiation is targeting a smaller volume of water than is contained in the main vessel 62 and thus the time required to provide the desired UV-C dose to the volume of water is less. Once the water is irradiated with a suitable dose of UVC, a fan 80 is used to blow the small droplets out of the nozzle 82 of the humidifier.

In a further embodiment the UV-C LED modules 10 are positioned outside the vessel 62 and they emit the UV-C radiation through a UV transparent window into the second vessel 90. The advantage of this embodiment is that the UV-C LED modules 10 may be placed outside of the removable water vessel 62, this reduces the requirement for electrical contacts to allow power to be transmitted to the LEDs whilst still allowing the water vessel to be removed. Such contacts may be embodied as a sliding contact type connector.

In another embodiment of the air humidifier the UV-C LED is integrated with a condenser lens to form a UV-C LED module 10. The UV-C module 10 is located inside the water vessel at the top and positioned such that the emitted UV-C light 66 is focused towards the vicinity of the exit valve 72 similar to a LED spot light. Nearby to the exit valve a UV-C transparent window is fitted between the water vessel 62 and the second vessel 90. This UV-C transparent window allows some of the UV-C light 66 to pass through and into the second vessel and thus to provide a desired dose of UVC light 66 to the water in the second vessel 90.

The UV-C transparent materials may be any UV-C transparent material such as quartz, glass-160 (a UV transparent soft glass), a UV-C transparent polymer material such as polycrystalline aluminium (PCA), Teflon or silicone.

Figure 11:
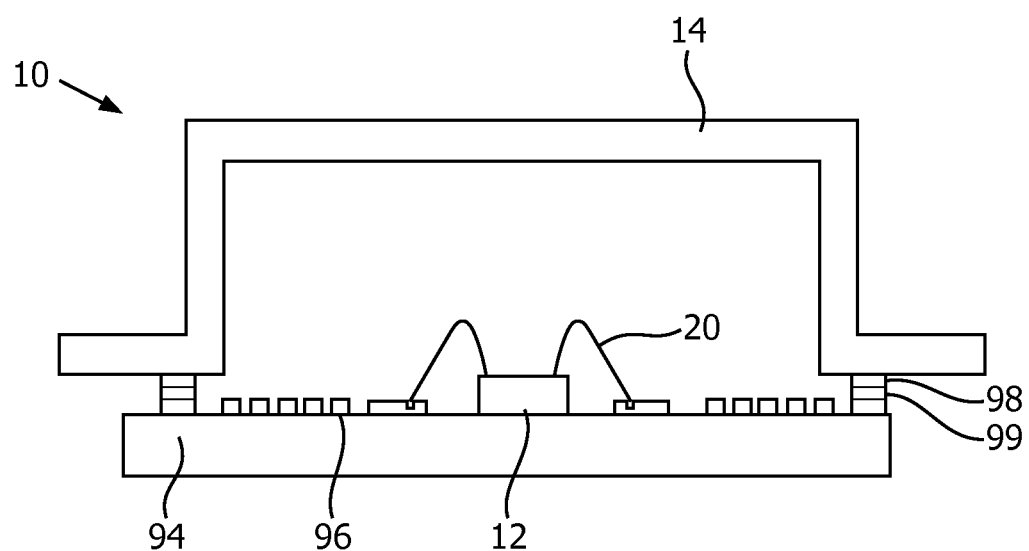
FIG. 11 shows a sixth example of a UV-C LED module that is watertight and powered inductively.
Figure 12A:
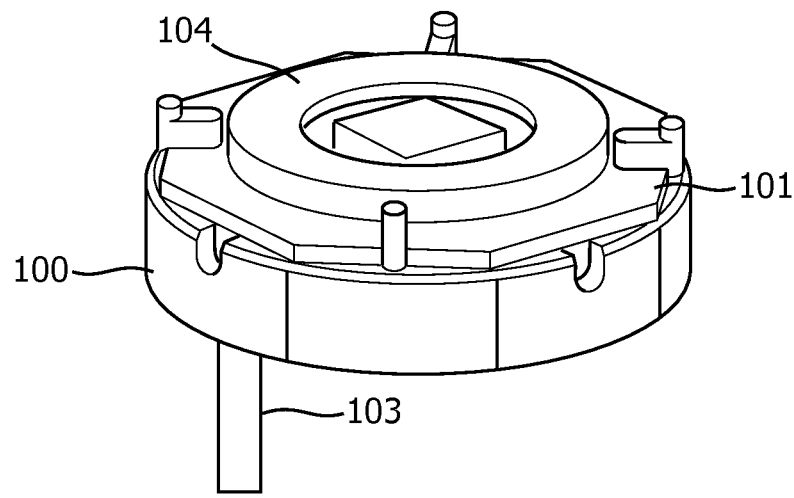
FIGS. 12$a$-$g$ show a seventh example of a UV-C module.
Figure 12B:
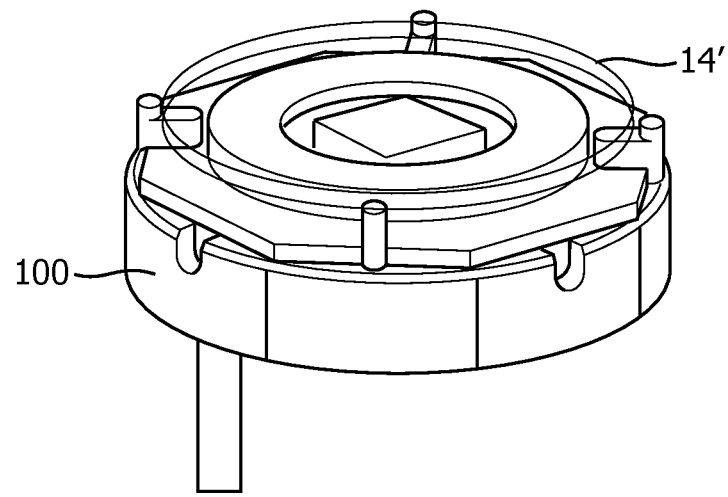
Figure 12C:
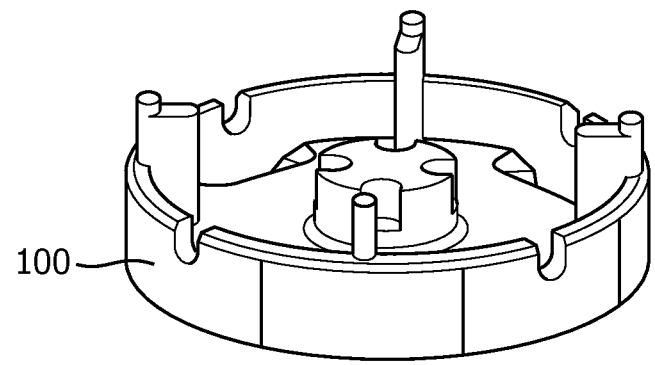
Figure 12D:
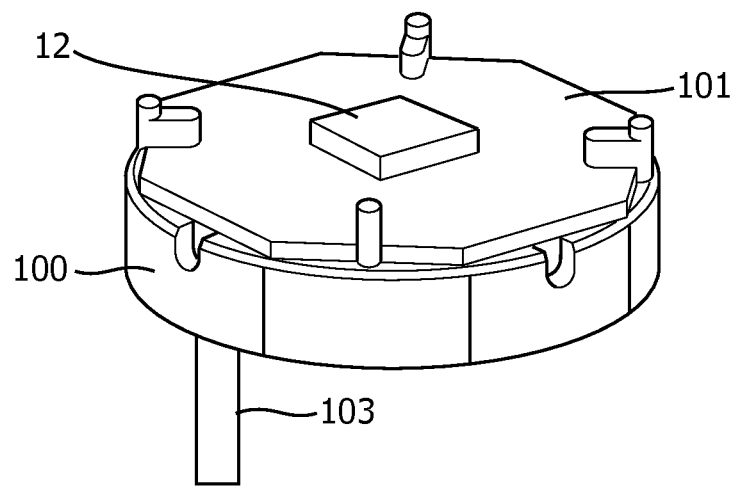
Figure 12E:
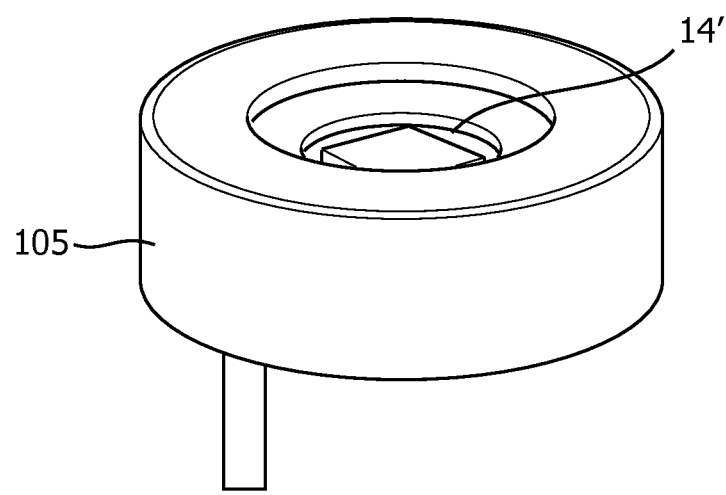
Figure 12F:
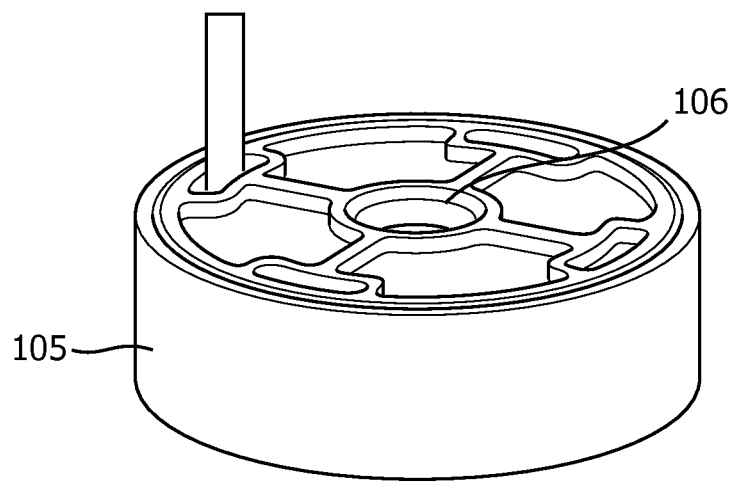
Figure 12G:
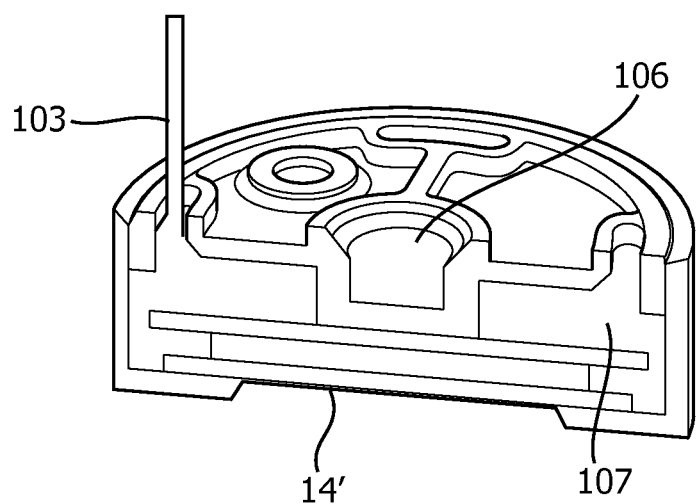

FIG. 11 shows a sixth example of a of a UV-C LED module 10 that is watertight and powered inductively. The UV LED die 12 is mounted on a ceramic substrate 94, the ceramic substrate is preferably reflective to increase the efficiency of the LED module 10 by reflecting any UV radiation that impinges on the reflective surface of the ceramic substrate 94 towards the translucent window element 14. An inductive coil 96 is also mounted on the ceramic substrate 94 to act as the receiver in a wireless power transfer system. This is connected to the UV LED die 12 by wirebonds 20.

A first solderable layer 98 is applied to the ceramic substrate 94 in a shape corresponding to the shape of the translucent window element 14. This shape could be a square, a rectangle, a circle or any other shape.

A second solderable layer 99 is applied to the translucent window element 14 and the ceramic substrate 94 and the translucent window element are brought into contact with each other. When the correct alignment has been achieved the solderable layer can be heated and this will seal the UV LED die 12 in a watertight UV translucent module 10.

FIGS. 12a-g show a seventh example of a UV-C module 10 comprising a seal 100 a PCB 101, a UV-C LED die 12, power wires 103, a reflector 104 a quartz window element 14' and a cover 105. The seal 100 ensures correct positioning of all the parts in relation to each other and it can feature fixation means, e.g. screw holes. The UV-C LED die 12 is mounted on the PCB 101 and these two components together are often known as a level 2 (L2) component. The UVC LED die 12 and the PCB 100 are mounted on top of the seal using mechanical protrusions to provide correct alignment. On top of these is placed the reflector 104, this reflector has multiple functions, the first is to reflect the UV-C radiation towards the quartz window element 14' so that the optical efficiency of the module 10 is improved, the second function is to act as a spacer for the quartz window element 14', the third function is to act as a barrier to the potting material 107 that is added to fully seal the module 10, this will ensure that the potting material 107 does not flow over the front of the LED die 12 blocking the light output. The fourth function is to act as a thermal connection between the PCB 101 and the quartz window element 14'. The fifth function is to protect the PCB 101 from the UV-C radiation.

The seal has protrusions on the top face (not shown), these protrude both axially and radially. The axial protrusions provide location for the PCB 101 and UVC LED die 12 and the cover 105 whilst the radial portion of the protrusions provide concentric location for the circular reflector 104 and quartz window element 14'.

After the quartz window element 14' has been placed on the top of the reflector 104 the cover 105 is mounted and again the axial protrusions provide a location for the cover 105.

The module 10 is then turned over and a potting material 107 is poured into a central hole 106 in the base of the seal 100. Additional vent holes may be provided in the seal to allow the egress of air from the module 10 when the potting material 107 is poured in. This is important as it reduces the likelihood of air pockets forming which reduce the thermal conductivity and may also impact the ingress protection (IP) rating of the module. Also, as a further advantage, the potting material surrounds the electrical wires 103 acting as a strain relief against mechanical forces damaging the connection of the wires to the PCB 101.

In a further embodiment, the PCB 101 may be single sided, that is to say all the required electrical components for driving the UV-C LED die 12 are placed on a single side of the PCB 101. This brings packaging advantages as the entire module 10 may therefore be made thinner.

3D printing techniques (also known as additive manufacturing) may be suitable to enable shapes of heatsinks or ceramic housings or modules to be manufactured that are more intricate that would be possible using common manufacturing techniques and may remove the need for such components to be manufactured in a factory or workshop. The user of the consumer device may be able to purchase the right to be able to 3D print a housing or heatsink to upgrade or repair their current consumer device to ensure the best possible performance of the UV-C module 10.

FIG. 13 shows another embodiment, in this example, the UVC LED die 12 may be mounted on a Al-IMS PCB. IMS means Insulated Metal Substrates. With IMS PCBs, instead of the usual base material aluminium is used as the carrier for copper. Aluminium core PCBs are often used to help with the thermal management of the circuit. The UV LED die 12 and PCB 101 is enclosed in a housing 105. The upper side of the module is closed with a quartz window element 14' to enable UV-C transmission to the surrounding medium whilst still ensuring adequate projection for the UVC LED die 12 from the environment.

A thermal heat flow can be calculated and modelled using computer techniques, for example finite Element Analysis (FEA). In a first experiment there was an air gap of 350 nm between the top of the UVC LED die 12 and the bottom of the quartz window element 14'. Table 2 below shows the thermal conductivities used:

TABLE 2

| Thermal conductivities. | |
| --- | --- |
| Material | Thermal conductivity W/mK |
| Aluminium | 237 |
| Quartz | 1.2 |
| Al-IMS | 140 |
| Plastic | 0.19 |
| Potting (for the driver) | 0.5 |
| UVC LED die material | 0.46 |

Both the UVC LED die 12 and driver components are mounted on the PCB 101, the heat input to the UVC LED die 12 is 0.126 W and 0.083 W to the driver components.

The whole module 10 is modelled as being surrounded by air. The exact material properties of the LED are not input. To allow accurate simulation the UVC LED die 12 is replaced with a block of material and the conductivity is varied until the calculated thermal resistance between the top and the bottom of the UVC LED die 12 meets the specified thermal resistance from junction to case.

Figure 14:
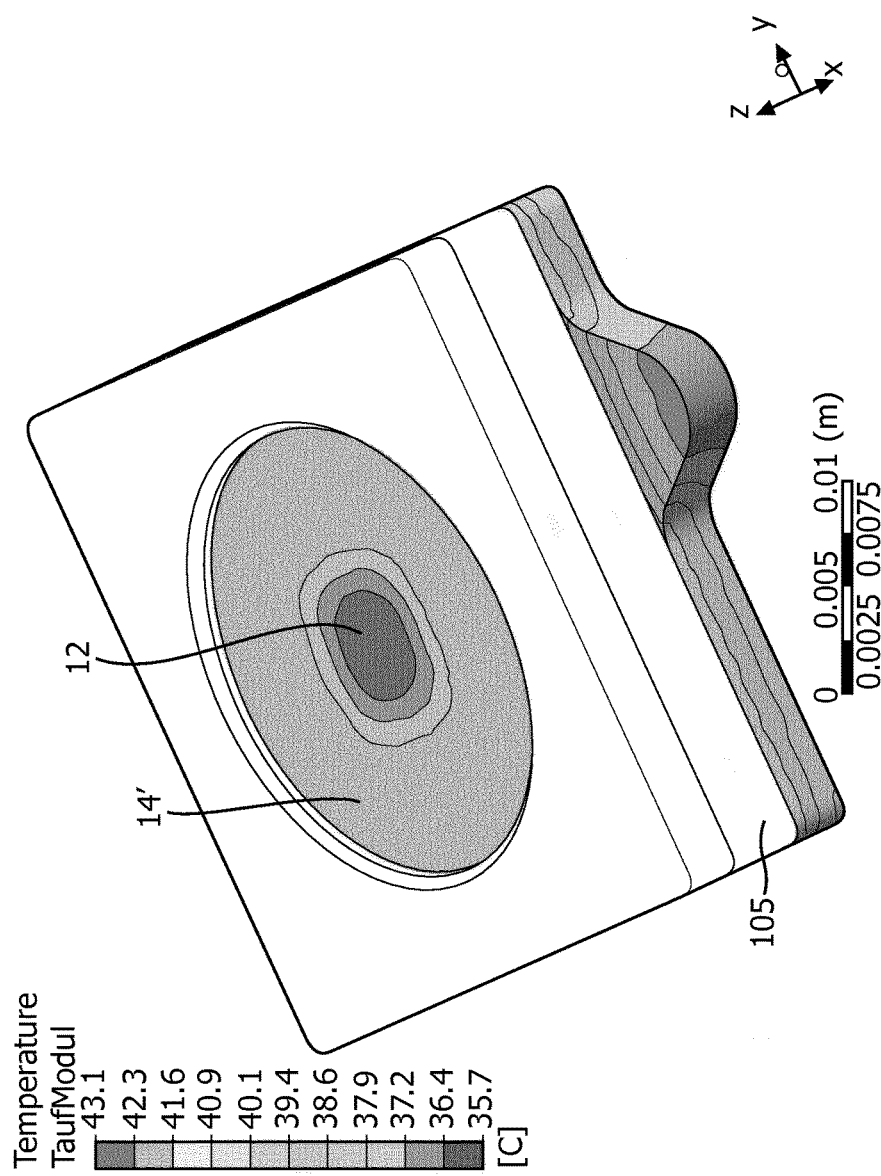
FIG. 14 shows an embodiment with a UVC LED die mounted on an IMS PCB, where a simulation was carried out with and without an attachment layer between the UVC LED die and a quartz window element.

A simulation was carried out with and without an attachment layer between the UVC LED die 12 and the quartz window element 14'. The housing 105 temperature increased by 2° C. and the $T_{max}$ of the UVC LED die 12 fell by a corresponding amount, this can be seen in FIG. 14. The actual temperatures calculated can be seen in table 3 below.

TABLE 3

Temperatures with and without attachment layer

| | Housing temperature ° C. $T_{max}$ | UVC LED die temperature ° C. $T_{max}$ |
|---|---|---|
| Without attachment layer | 41.1 | 45.7 |
| With attachment layer | 43.1 | 43.6 |

It can be understood that if we change the boundary condition of transferring the heat generated from air to transferring the heat to water than the thermal resistance drops considerably. This embodiment allows us to use the top of the UVC LED die 12 to transmit heat in addition to the commonly used bottom surface of the UVC LED die 12.

Suitable materials for the attachment layer are for instance borates or a coating made of polymerized alkyltriakloxysilanes or polymerized aryltriakloxysilanes such as trimethoxysilane and triethoxysilane with or without the addition of nano-silica particles. Alternatively UV-grade silicone lacquers or glues can be used.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A UV-C water purification device, comprising:
    one or more UV-C LED modules for administering UV-C light to a body of water, each module comprising:
        one or more UV-C LED dies, each die having a bottom surface and a top surface, and
        one or more UV-C-translucent window elements,
    wherein each of the UV-C LED dies is at least partly embedded in a UV-C-translucent window element, and wherein each of the UV-C LED dies is solidly coupled against an associated UV-C-translucent window element, such that at least one of the bottom or top surfaces of the UV-C die is in optical communication with the associated UV-C-translucent window element, and wherein the one or more UV-C-translucent window elements comprise electrical tracks for delivering current to one or more terminals of the one or more UV-C LED dies, and wherein the one or more UV-C-translucent window elements is for transferring heat from the one or more UV-C LED dies,
    wherein the UV-C water purification device further comprises a sealing layer disposed over either the top or bottom surface of the or each UV-C LED die, the sealing being UV-C light reflective.

2. A UV-C water purification device as claimed in claim 1, wherein the one or more UV-C LED dies is a flipchip LED die.

3. A UV-C water purification device as claimed in claim 1, wherein the bottom surface of the one or more UV-C LED dies comprises a surface of a die substrate, and wherein said bottom surface is in optical communication with the associated UV-C-translucent window.

4. A UV-C water purification device as claimed in claim 1, wherein the one or more UV-C-translucent window elements comprises a translucent ceramic.

5. A UV-C water purification device as claimed in claim 1, wherein the one or more UV-C LED modules comprises a water-resistant encapsulation.

6. A UV-C water purification device as claimed in claim 1, further comprising an adhesive between each UV-C LED die and the associated UV-C-translucent window element.

7. A method of producing a water purification device, comprising:
    at least partially embedding each of one or more UV-C LED dies in one or more translucent window elements,
    solidly coupling one or more UV-C LED dies against the one or more UV-C-translucent window elements, wherein the one or more UV-C-translucent window elements comprise electrical tracks for delivering current to one or more terminals of the one or more UV-C LED dies, each UV-C LED die having a bottom surface and a top surface, and the coupling being such that such that at least one of the bottom or top surfaces of each UV-C LED die is in optical communication with an associated UV-C-translucent window element, said coupling thereby generating one or more UV-C LED modules for administering UV-C light to a body of water, and
    providing a sealing layer disposed over a surface of each of the one or more UV-C LED dies, the sealing being UV-C light reflective.

* * * * *